United States Patent
Yen et al.

(10) Patent No.: US 11,670,669 B2
(45) Date of Patent: Jun. 6, 2023

(54) INTEGRATED TRANSFORMER

(71) Applicant: REALTEK SEMICONDUCTOR CORPORATION, Hsinchu (TW)

(72) Inventors: Hsiao-Tsung Yen, Hsinchu (TW); Ka-Un Chan, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 724 days.

(21) Appl. No.: 16/742,960

(22) Filed: Jan. 15, 2020

(65) Prior Publication Data

US 2020/0343334 A1 Oct. 29, 2020

(30) Foreign Application Priority Data

Apr. 25, 2019 (TW) .................................. 108114413

(51) Int. Cl.
*H01F 27/28* (2006.01)
*H01L 23/522* (2006.01)
*H01L 23/528* (2006.01)
*H01L 49/02* (2006.01)
*H01L 23/66* (2006.01)

(52) U.S. Cl.
CPC ......... *H01L 28/10* (2013.01); *H01F 27/2804* (2013.01); *H01L 23/528* (2013.01); *H01L 23/5227* (2013.01); *H01F 2027/2819* (2013.01); *H01L 23/66* (2013.01)

(58) Field of Classification Search
None
See application file for complete search history.

(56) References Cited

U.S. PATENT DOCUMENTS 9,934,898 B2 * 4/2018 Mattsson ............ H01L 23/5227
10,153,078 B2 12/2018 Yen et al.
(Continued)

FOREIGN PATENT DOCUMENTS

CN 106571211 A 4/2017
CN 107731485 A 2/2018

OTHER PUBLICATIONS

OA letter of the counterpart CN application (appl. No. 201910361936.X) mailed on May 27, 2021. Summary of the OA letter: Claims 1~10 are rejected under Chinese Patent Act §22-3 as being unpatentable over D1(CN106571211A) in view of D2(CN107731485A).
(Continued)

*Primary Examiner* — Nishath Yasmeen
(74) *Attorney, Agent, or Firm* — WPAT, P.C (57) ABSTRACT

An integrated transformer includes a first and second inductors. The first inductor includes a first and second windings. The second inductor includes a third and fourth windings. The first, second, third and fourth windings have a first, second, third and fourth outer turn, respectively. At least one segment of the first (or second) outer turn substantially overlaps at least one segment of the third (or fourth) outer turn. The first and second outer turns are connected through a first segment and a first trace that cross each other, and the third and fourth outer turns are connected through a second trace and a second segment that cross each other. The first trace and the second segment are on the first metal layer, and the first segment and the second trace are on the second metal layer different from the first metal layer.

14 Claims, 7 Drawing Sheets

(56) References Cited

U.S. PATENT DOCUMENTS

| | | | |
|---|---|---|---|
| 10,497,507 B2 | 12/2019 | Yen et al. | |
| 2005/0195063 A1* | 9/2005 | Mattsson | H01F 27/346 336/225 |
| 2012/0241904 A1* | 9/2012 | Wu | H01L 27/08 257/E27.07 |
| 2012/0244802 A1* | 9/2012 | Feng | H04B 5/0087 336/225 |
| 2014/0077919 A1* | 3/2014 | Godoy | H01F 27/006 336/226 |
| 2015/0170824 A1* | 6/2015 | Tesson | H01F 27/2804 336/190 |
| 2015/0364243 A1 | 12/2015 | Yen et al. | |
| 2017/0012601 A1* | 1/2017 | Yen | H03H 7/42 |
| 2017/0098500 A1* | 4/2017 | Yen | H01F 27/29 |
| 2019/0089304 A1* | 3/2019 | Moslehi Bajestan | H01F 21/12 |
| 2019/0148479 A1* | 5/2019 | Yen | H01L 23/5227 336/173 |
| 2019/0221350 A1* | 7/2019 | Yen | H01F 27/006 |
| 2019/0279809 A1* | 9/2019 | Yen | H01F 17/0006 |
| 2019/0392980 A1 | 12/2019 | Yen | |
| 2020/0251550 A1 | 8/2020 | Yen et al. | |

OTHER PUBLICATIONS

OA letter of a US application (U.S. Appl. No. 16/722,578) dated Apr. 19, 2022.
U.S. Appl. No. 16/293,876, "Inductor Device", filed Mar. 6, 2019(YYYY-MM-DD).
U.S. Appl. No. 16/375,062 , "Transformer Device", filed Mar. 6, 2019(YYYY-MM-DD).
U.S. Appl. No. 16/722,578, "Integrated transformer", filed Dec. 20, 2019(YYYY-MM-DD).

* cited by examiner

INTEGRATED TRANSFORMER

BACKGROUND OF THE INVENTION

1. Field of the Invention

The present invention generally relates to semiconductor devices, and, more particularly, to integrated transformers.

2. Description of Related Art

Transformers are important elements in radio frequency (RF) integrated circuits to implement single-ended to differential signal conversion, signal coupling and impedance matching. As System-on-chips (SoC) become the mainstream of integrated circuits, integrated transformers are gradually substituted for conventional discrete elements and are commonly applied to RF integrated circuits. However, transformers in integrated circuits often take up large areas; therefore, it becomes an important issue to reduce the areas of transformers in integrated circuits without degrading element performances, such as coupling coefficient (K).

In particular, an 8-shaped integrated transformer is hard to design due to its crossing structure in the central area and its symmetry.

SUMMARY OF THE INVENTION

In view of the issues of the prior art, an object of the present invention is to provide integrated transformers, so as to make an improvement to the prior art.

An integrated transformer is provided. The integrated transformer includes a first inductor and a second inductor. The first inductor includes a first winding and a second winding. The first winding has a first outer turn, and the second winding has a second outer turn. The first outer turn and the second outer turn share a first trace, and the first outer turn and the second outer turn are connected through a second trace. The second inductor includes a third winding and a fourth winding. The third winding has a third outer turn, and the fourth winding has a fourth outer turn. The third outer turn and the fourth outer turn share a third trace, and the third outer turn and the fourth outer turn are connected through a fourth trace. The first trace and the second trace form a first crossing structure, and the third trace and the fourth trace form a second crossing structure. The first trace and the fourth trace are implemented on a first metal layer of a semiconductor structure, and the second trace and the third trace are implemented on a second metal layer of the semiconductor structure. The first metal layer is different from the second metal layer.

An integrated transformer is also provided. The integrated transformer includes a first inductor and a second inductor. The first inductor includes a first winding and a second winding. The first winding has a first outer turn, and the second winding has a second outer turn. The second inductor includes a third winding and a fourth winding. The third winding has a third outer turn, and the fourth winding has a fourth outer turn. At least one segment of the first outer turn and at least one segment of the third outer turn substantially overlap, and at least one segment of the second outer turn and at least one segment of the fourth outer turn substantially overlap. The first outer turn is connected to the second outer turn through a first segment and a first trace which cross each other, and the third outer turn is connected to the fourth outer turn through a second trace and a second segment which cross each other. The first trace and the second segment are implemented on a first metal layer of a semiconductor structure, and the first segment and the second trace are implemented on a second metal layer of the semiconductor structure. The first metal layer is different from the second metal layer.

Compared with the traditional technology, the integrated transformers of the present invention have the following advantages: (1) each of the two inductors of the integrated transformer is good in symmetry itself; (2) the two crossing structures in the central area of the integrated transformer use only two metal layers, which makes the integrated transformer easy to implement.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly.

The disclosure herein includes integrated transformers. On account of that some or all elements of the integrated transformers could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 1A:
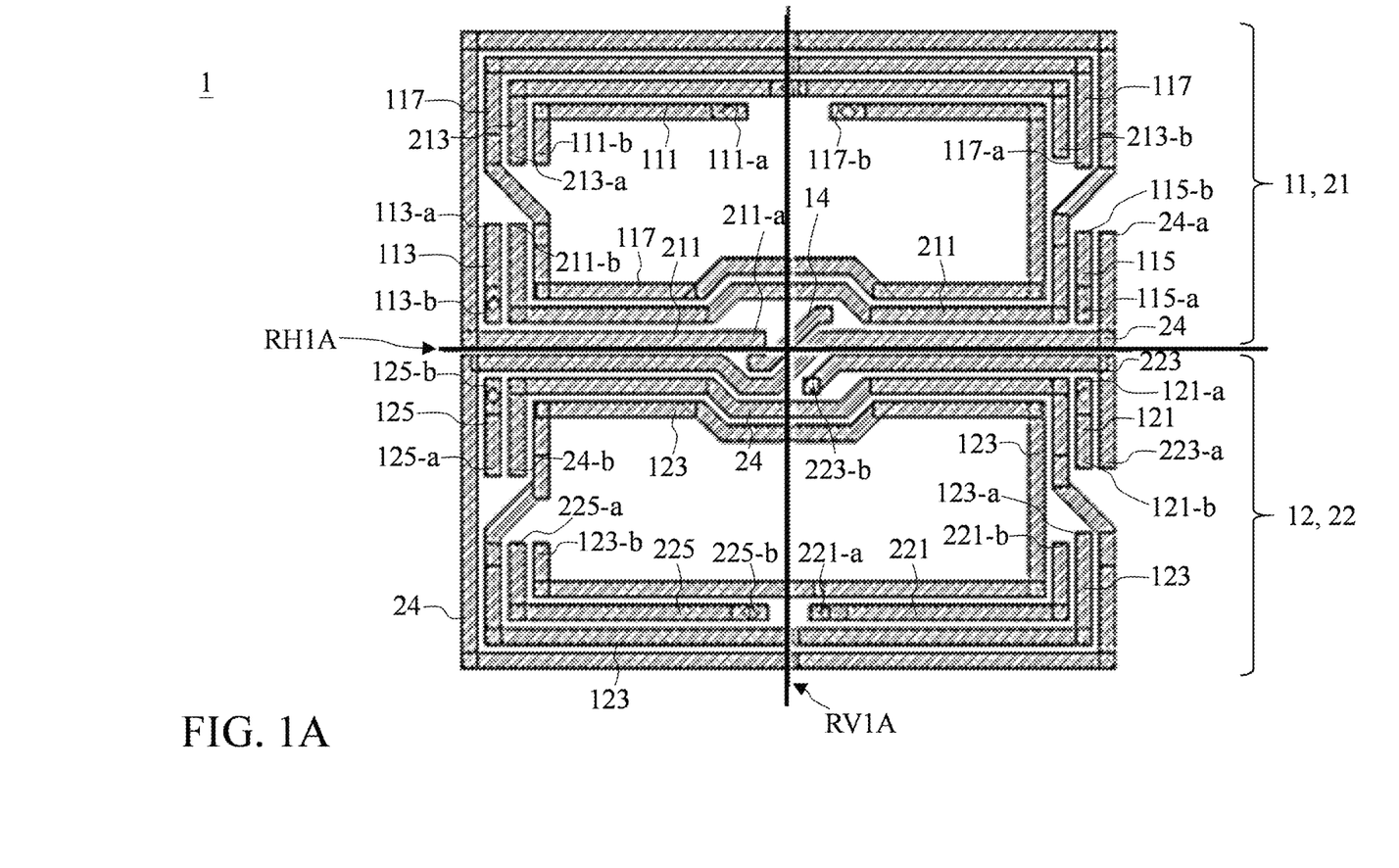
FIGS. 1A to 1C illustrate the layout of an integrated transformer according to an embodiment of the present invention.
Figure 1B:
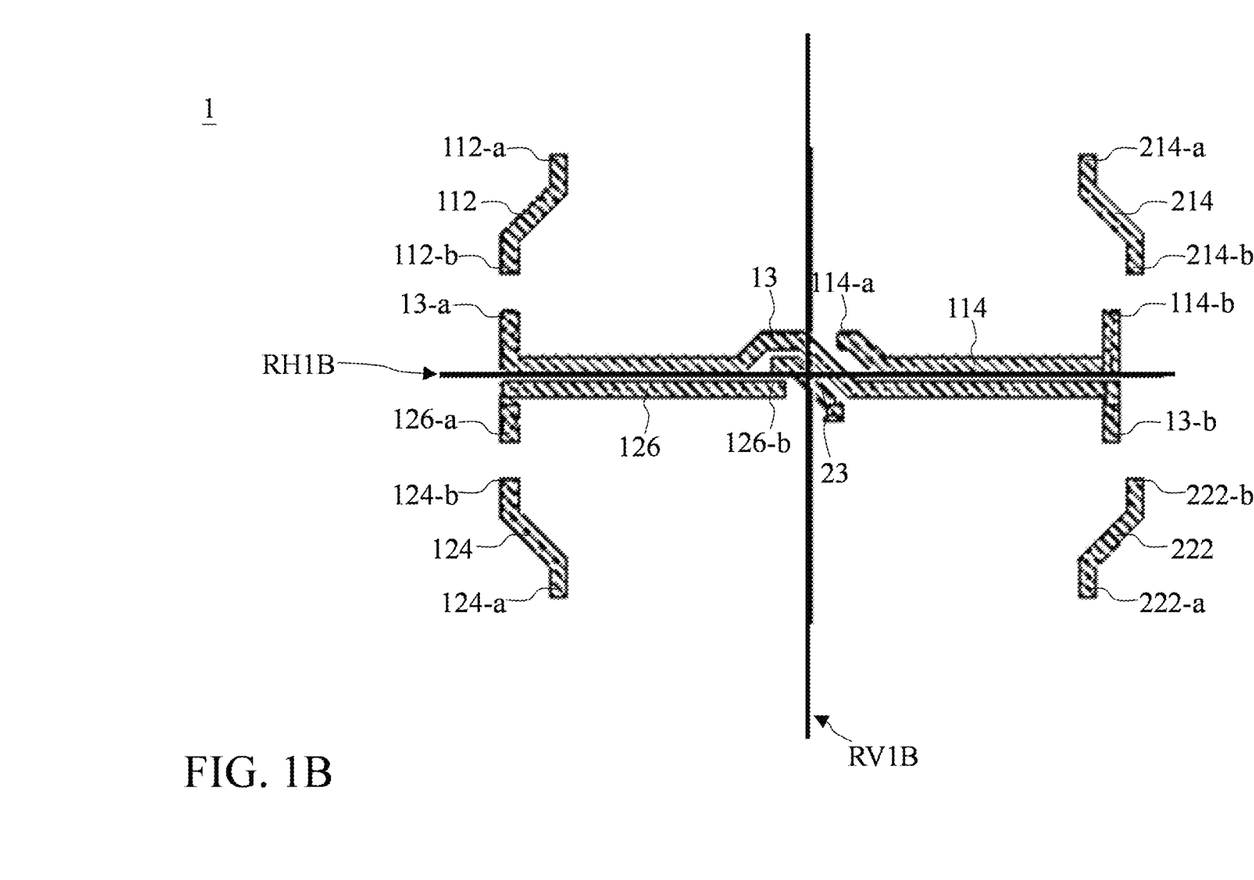
Figure 1C:
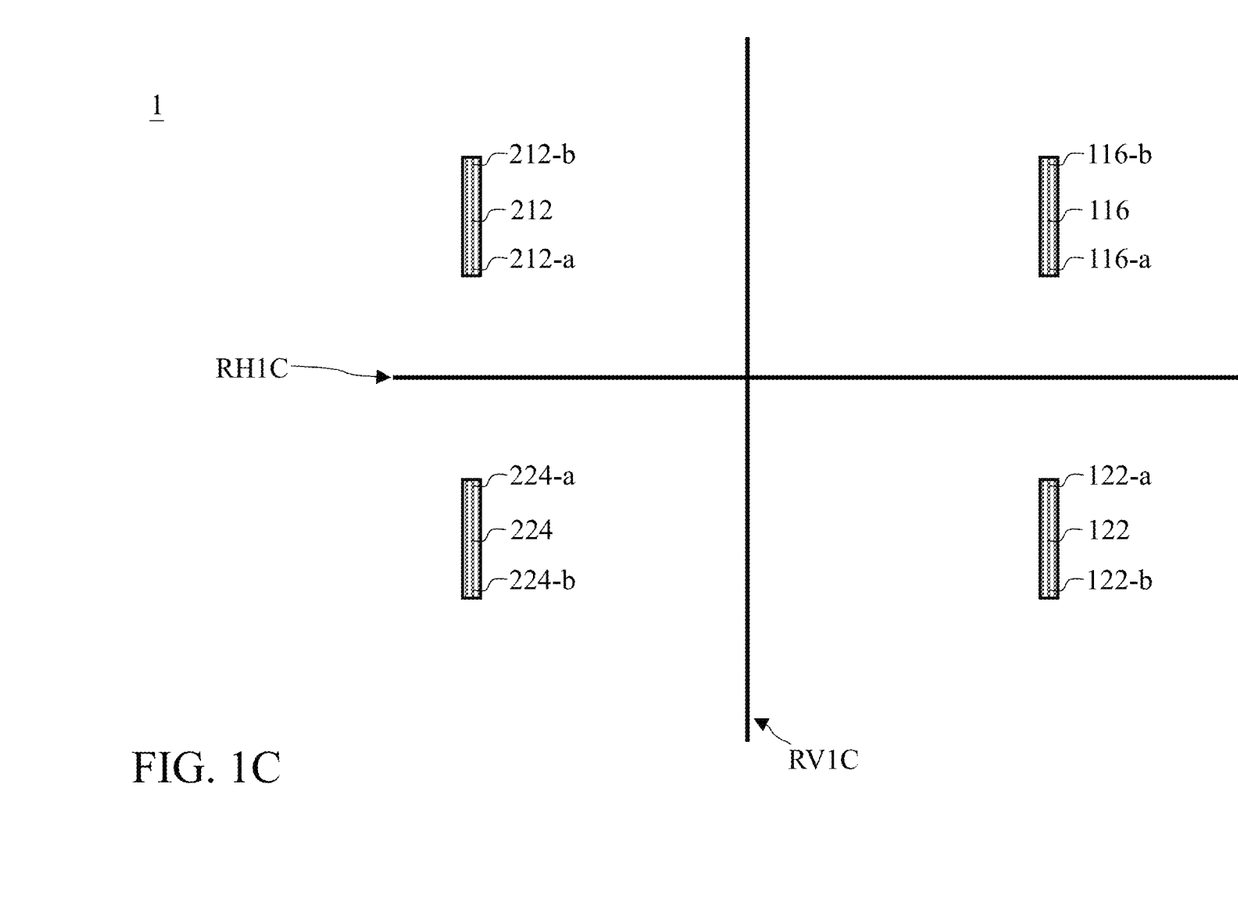

FIGS. 1A to 1C show the layout of the integrated transformer according to an embodiment of the present invention. The integrated transformer 1 is formed by multiple traces. Most of the traces are implemented on the first metal layer (FIG. 1A), and a small number of the traces are implemented on the second metal layer (FIG. 1B) and the third metal layer. (FIG. 1C). A trace can be divided into several segments. The integrated transformer 1 mainly includes four windings: winding 11, winding 12, winding 21, and winding 22. The winding 11 and the winding 12 form one of the inductors of the integrated transformer 1, while the winding 21 and the winding 22 form the other inductor. The first, second and third metal layers are different metal layers. For example, the first metal layer can be the re-distribution layer (RDL) in the semiconductor structure, the second metal layer can be the ultra-thick metal (UTM) layer in the semiconductor structure, and the third metal layer can be the sixth metal layer in a semiconductor structure.

The winding 11 includes the trace 111, the trace 112, the trace 113, the trace 114, the trace 115, the trace 116 and the trace 117. The winding 12 includes the trace 121, the trace 122, the trace 123, the trace 124, the trace 125 and the trace 126. The winding 11 and the winding 12 share the trace 13 and the trace 14. The winding 11 and the winding 12 together form an inductor 10.

The end point 111-b is connected to the end point 112-a. More specifically, the connected end points are connected through a through structure such as a via structure or a via array. Similarly, the end point 112-b is connected to the end point 113-a; the end point 113-b is connected to the end point 13-a; the end point 13-b is connected to the end point 121-a; the end point 121-b is connected to the end point 122-a; the end point 122-b is connected to the end point 123-a; the end point 123-b is connected to the end point 124-a; the end point 124-b is connected to the end point 125-a; the end point 125-b is connected to the end point 126-a; the end point 126-b is connected to one of the end points of the trace 14; the other end point of the trace 14 is connected to the end point 114-a; the end point 114-b is connected to the end point 115-a; the end point 115-b is connected to the end point 116-a; and the end point 116-b is connected to the end point 117-a. The end points 111-a and 117-b are the output/input terminals of the inductor 10 and form one of the ports of the integrated transformer 1.

The winding 21 includes the trace 211, the trace 212, the trace 213 and the trace 214. The winding 22 includes the trace 221, the trace 222, the trace 223, the trace 224 and the trace 225. The winding 21 and the winding 22 share the trace 23 and the trace 24. The winding 21 and the winding 22 together form an inductor 20.

The end point 221-b is connected to the end point 222-a. The end point 222-b is connected to the end point 223-a. The end point 223-b is connected to one of the end points of the trace 23; the other end point of the trace 23 is connected to the end point 211-a. The end point 211-b is connected to the end point 212-a. The end point 212-b is connected to the end point 213-a. The end point 213-b is connected to the end point 214-a. The end point 214-b is connected to the end point 24-a. The end point 24-b is connected to the end point 224-a, and the end point 224-b is connected to the end point 225-a. The end points 221-a and 225-b are the output/input terminals of the inductor 20 and form one of the ports of the integrated transformer 1.

The reference line RH1A, the reference line RV1A, the reference line RH1B, the reference line RV1B, the reference line RH1C and the reference line RV1C in FIGS. 1A to 1C are used merely for discussion; they are not part of the integrated transformer or integrated inductor. The reference line RH1A, the reference line RH1B and the reference line RH1C overlap, and the reference line RV1A, the reference line RV1B and the reference line RV1C overlap. In other words, the center points of in FIGS. 1A to 1C overlap.

Figure 2A:
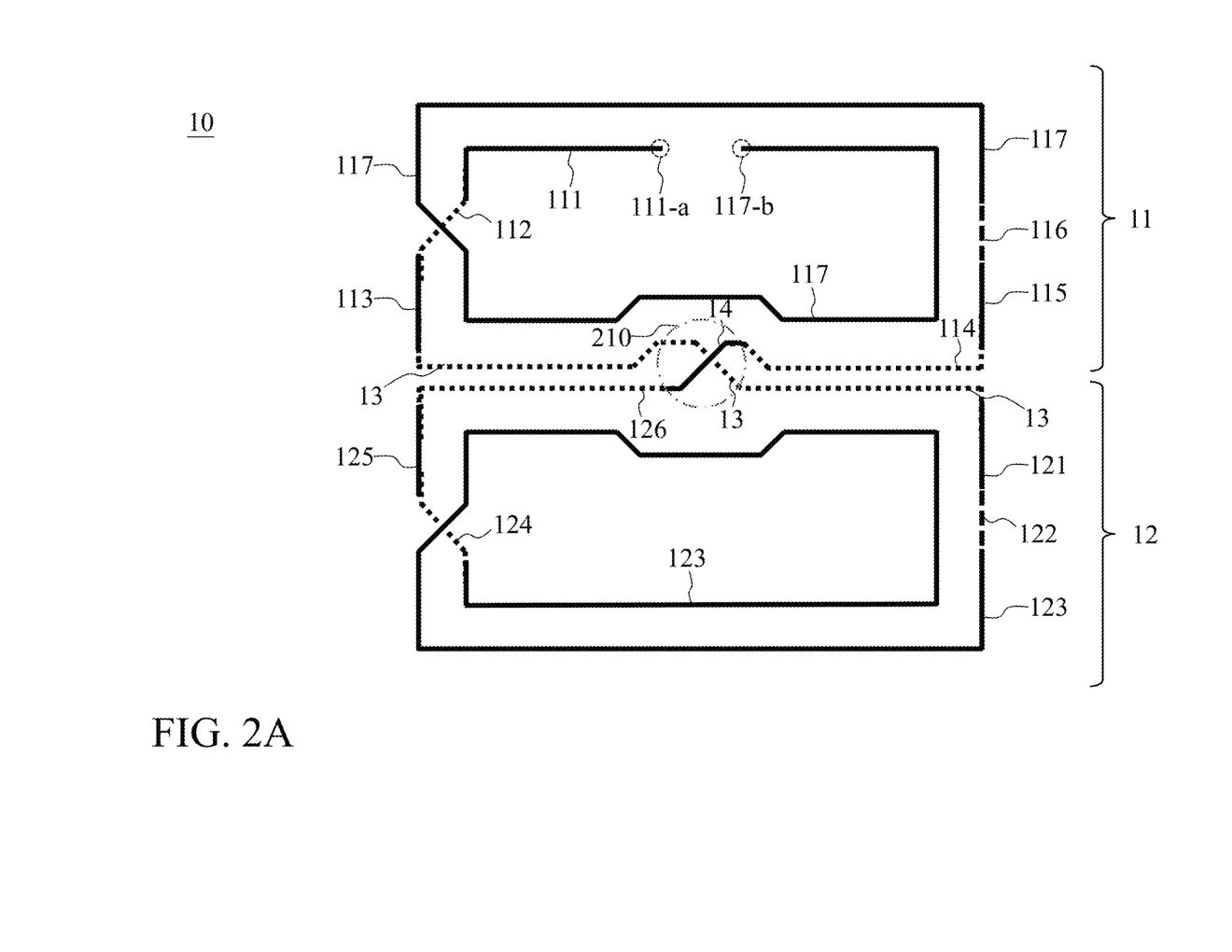
FIG. 2A illustrates a schematic diagram of one of the inductors of the integrated transformer.

FIG. 2A is a schematic diagram of the inductor 10. The trace 111, the trace 113, the trace 115, the trace 117, the trace 121, the trace 123, the trace 125 and the trace 14 are implemented on the first metal layer (represented by the solid lines). The trace 112, the trace 114, the trace 124, the trace 126 and the trace 13 are implemented on the second metal layer (represented by the first type of broken lines). The trace 116 and the trace 122 are implemented on the third metal layer (represented by the second type of broken lines). The outer turn of the winding 11 includes part of the trace 13, the trace 113, part of the trace 112, part of the trace 117, the trace 116, the trace 115, the trace 114 and part of the trace 14. The inner turn of the winding 11 includes the trace 111, part of the trace 112 and part of the trace 117. The outer turn of the winding 12 includes part of the trace 13, the trace 121, the trace 122, part of the trace 123, part of the trace 124, the trace 125, the trace 126 and part of the trace 14. The inner turn of the winding 12 includes part of the trace 123 and part of the trace 124. The inner turn of the winding 11 and the inner turn of the winding 12 are substantially implemented on the first metal layer. Except for some segments of the outer turn of the winding 11 and some segments of the outer turn of the winding 12, most segments of the inductor 10 (i.e., the winding 11 and the winding 12) are substantially implemented on the first metal layer. More specifically, the inductor 10 is substantially implemented on the first metal layer, except for the trace 13, the trace 112, the trace 114, the trace 116, the trace 122, the trace 124 and the trace 126. As shown in FIG. 2A, the winding 11 is substantially symmetrical to the winding 12.

A crossing structure is formed at the center (i.e., approximately the area 210) of the integrated transformer 1. The crossing structure is formed by two segments, one of which is the trace 14 or part of the trace 14, and the other of which is part of the trace 13. The outer turn of the winding 11 and the outer turn of the winding 12 are connected through this crossing structure; in other words, the winding 11 and the winding 12 are connected through this crossing structure.

Figure 2B:
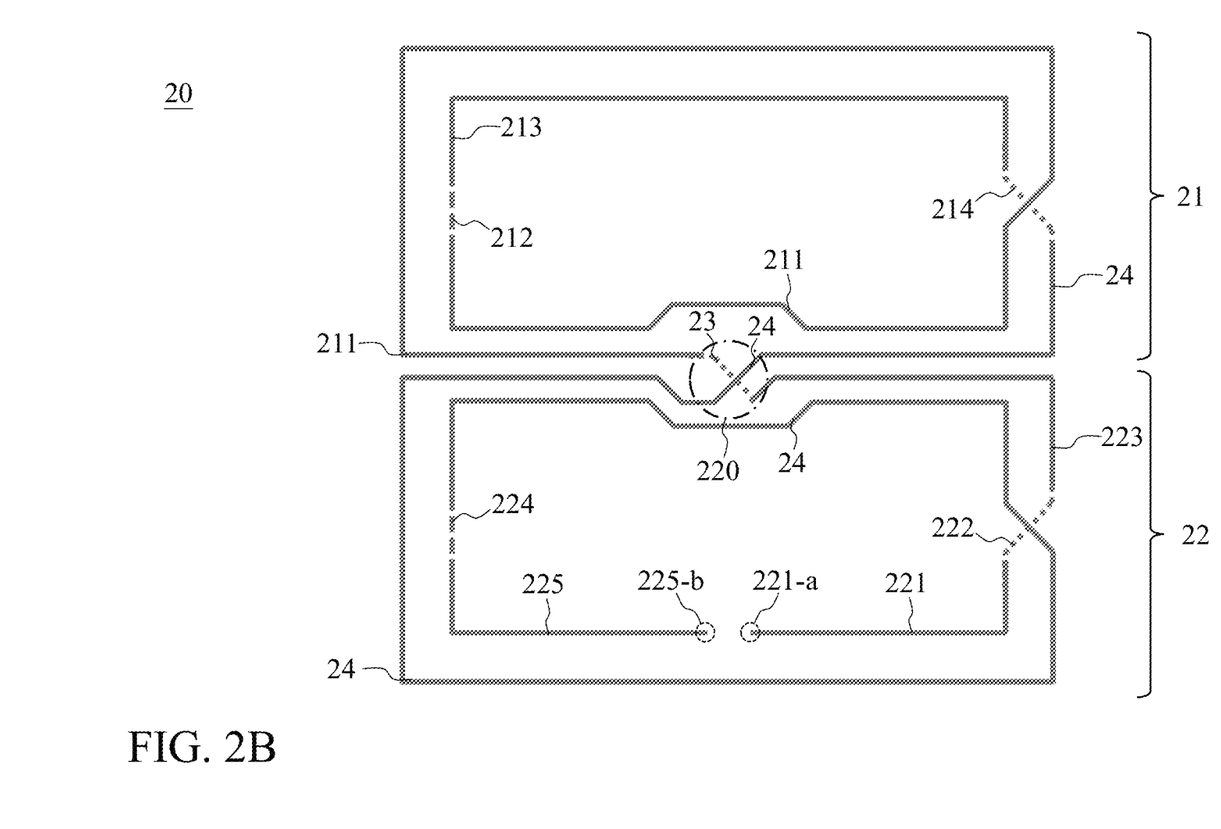
FIG. 2B illustrates a schematic diagram of the other inductor of the integrated transformer.

FIG. 2B is a schematic diagram of the inductor 20. The trace 211, the trace 213, the trace 221, the trace 223, the trace 225 and the trace 24 are implemented on the first metal layer (represented by the solid lines). The trace 214, the trace 222 and the trace 23 are implemented on the second metal layer (represented by the first type of broken lines). The trace 212 and the trace 224 are implemented on the third metal layer (represented by the second type of broken lines). The outer turn of the winding 21 includes part of the trace 23, part of the trace 211, part of the trace 214 and part of the trace 24. The inner turn of the winding 21 includes part of the trace 211, the trace 212, the trace 213 and part of the trace 214. The outer turn of the winding 22 includes part of the trace 23, the trace 223, part of the trace 222 and part of the trace 24. The inner turn of the winding 22 includes the trace 221, part of the trace 222, part of the trace 24, the trace 224 and the trace 225. Most segments of the inductor 20 (i.e., the winding 21 and the winding 22) are substantially implemented on the first metal layer. More specifically, the inductor 20 is substantially implemented on the first metal layer, except for the trace 23, the trace 212, the trace 214, the trace 222 and the trace 224. As shown in FIG. 2B, the winding 21 is substantially symmetrical to the winding 22.

A crossing structure is formed at the center (i.e., approximately the area 220) of the integrated transformer 1. The crossing structure is formed by two segments, one of which is the trace 23 or part of the trace 23, and the other of which is part of the trace 24. The outer turn of the winding 21 and the outer turn of the winding 22 are connected through this crossing structure; in other words, the winding 21 and the winding 22 are connected through this crossing structure.

Figure 2C:
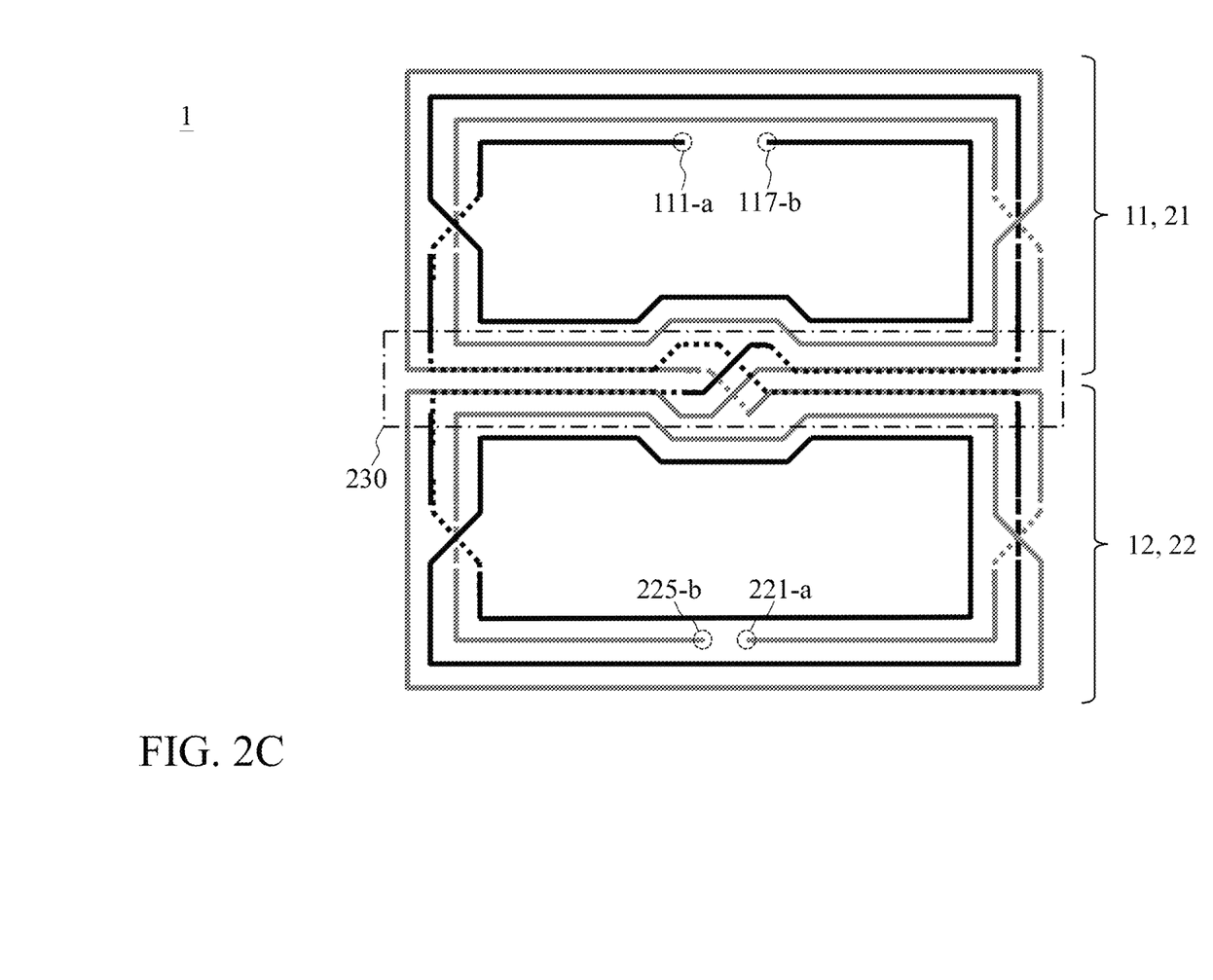
FIG. 2C illustrates a schematic diagram of the integrated transformer.

FIG. 2C illustrates a schematic diagram of the integrated transformer 1. The inductor 10 (including the winding 11 and the winding 12) is represented by the black lines, whereas the inductor 20 (including the winding 21 and the winding 22) is represented by the gray lines. Near the center (i.e., approximately the area 230) of the integrated transformer 1, some segments of the outer turn of the winding 11 and some segments of the outer turn of the winding 21 are parallel and substantially overlap, and some segments of the outer turn of the winding 12 and some segments of the outer turn of the winding 22 are parallel and substantially overlap. The inner turn of the winding 11 and the inner turn of the winding 21 do not overlap, and the inner turn of the winding 12 and the inner turn of the winding 22 do not overlap. The winding 11 is substantially surrounded by the outer turn of the winding 21, that is, the area of the winding 11 is smaller than the area of the winding 21. The winding 12 is substantially surrounded by the outer turn of the winding 22, that is, the area of the winding 12 is smaller than the area of the winding 22. In addition, the area of the inductor 10 is smaller than the area of the inductor 20.

Figure 3:
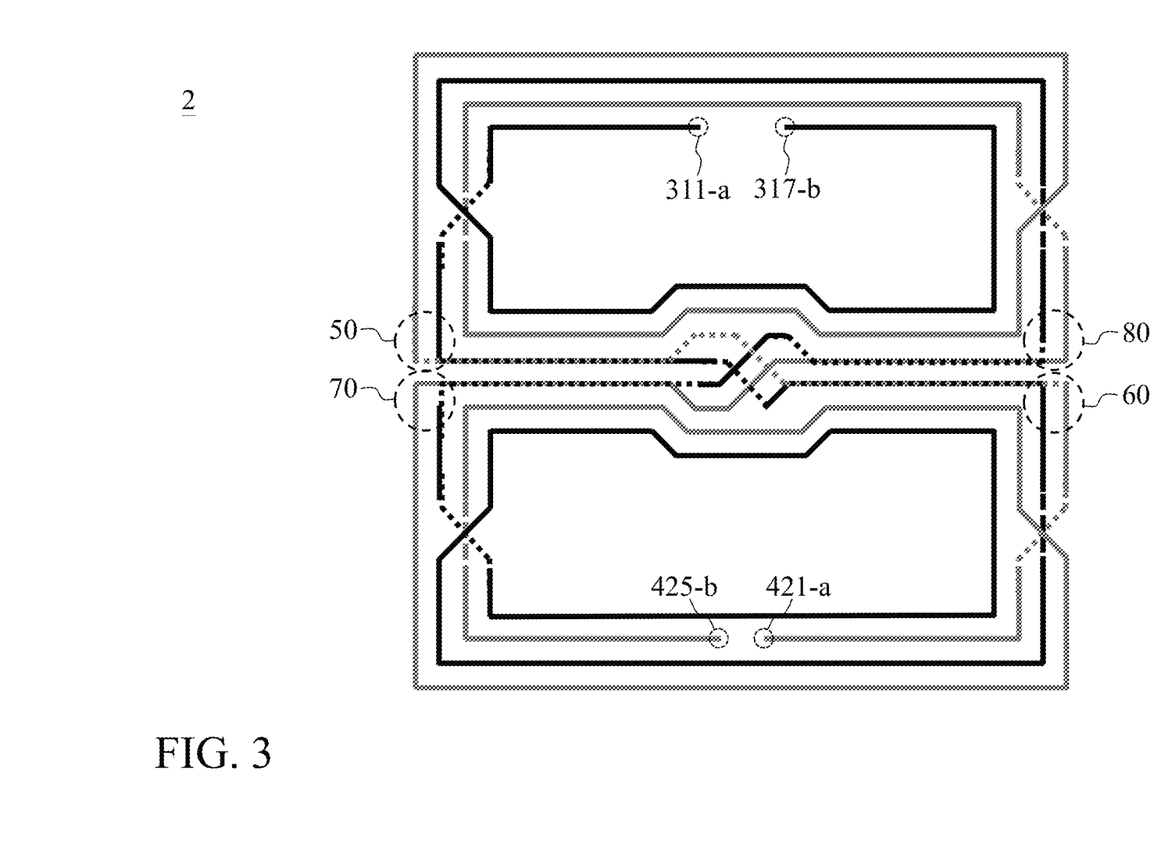
FIG. 3 illustrates a schematic diagram of an integrated transformer according to another embodiment of the present invention.

FIG. 3 shows the layout of the integrated transformer according to another embodiment of the present invention. The integrated transformer 2 includes a first inductor (represented by the black lines) and a second inductor (represented by the gray lines). The end points 311-a and 317-b are the output/input terminals of the first inductor and form one of the ports of the integrated transformer 2. The end points 421-a and 425-b are the output/input terminals of the second inductor and form the other port of the integrated transformer 2.

The integrated transformer 2 in FIG. 3 is similar to the integrated transformer 1 in FIG. 2C, except that the connections in the area 50 and the area 60 are slightly different. However, the integrated transformer 1 and the integrated transformer 2 have similar characteristics. In other words, those having ordinary skill in the art can modify the connections in the areas 50, 60, 70 and 80 to render different integrated transformers. However, the integrated transformers modified through this manner are equivalent to the integrated transformer 1 and thus embraced by the scope of the claimed invention.

In the foregoing embodiments, the number of turns of the windings is only for illustration, not for limiting the scope of this invention. Those having ordinary skill in the art can implement the windings with an arbitrary number of turns based on the discussion of the foregoing embodiments.

Please note that the shape, size, and ratio of any element in the disclosed figures are exemplary for understanding, not for limiting the scope of this invention. The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An integrated transformer, comprising:
   a first inductor comprising a first winding and a second winding, wherein the first winding has a first outer turn, the second winding has a second outer turn, the first outer turn and the second outer turn share a first trace, and the first outer turn and the second outer turn are connected through a second trace; and
   a second inductor comprising a third winding and a fourth winding, wherein the third winding has a third outer turn, the fourth winding has a fourth outer turn, the third outer turn and the fourth outer turn share a third trace, and the third outer turn and the fourth outer turn are connected through a fourth trace;
   wherein the first trace and the second trace form a first crossing structure, the third trace and the fourth trace form a second crossing structure, the first trace and the fourth trace are implemented on a first metal layer of a semiconductor structure, the second trace and the third trace are implemented on a second metal layer of the semiconductor structure, and the first metal layer is different from the second metal layer;
   wherein at least one segment of the first outer turn and at least one segment of the third outer turn are parallel and substantially overlap in a direction perpendicular to the first metal layer and the second metal layer, and at least one segment of the second outer turn and at least one segment of the fourth outer turn are parallel and substantially overlap in the direction perpendicular to the first metal layer and the second metal layer.

2. The integrated transformer of claim 1, wherein the first winding has a first inner turn, the second winding has a second inner turn, the third winding has a third inner turn, and the fourth winding has a fourth inner turn; wherein the first inner turn and the third inner turn do not overlap, and the second inner turn and the fourth inner turn do not overlap.

3. The integrated transformer of claim 1, wherein the first winding is substantially surrounded by the third outer turn, and the second winding is substantially surrounded by the fourth outer turn.

4. The integrated transformer of claim 1, wherein an area of the first inductor is smaller than an area of the second inductor.

5. An integrated transformer, comprising:
   a first inductor comprising a first winding and a second winding, wherein the first winding has a first outer turn, and the second winding has a second outer turn; and
   a second inductor comprising a third winding and a fourth winding, wherein the third winding has a third outer turn, and the fourth winding has a fourth outer turn;
   wherein at least one segment of the first outer turn and at least one segment of the third outer turn substantially overlap, at least one segment of the second outer turn and at least one segment of the fourth outer turn substantially overlap, a first segment connects the first outer turn and the second outer turn, a first trace connects the first outer turn and the second outer turn, the first segment and the first trace cross each other, a second segment connects the third outer turn and the fourth outer turn, a second trace connects the third outer turn and the fourth outer turn, the second segment and the second trace cross each other, the first trace and the second segment are implemented on a first metal layer of a semiconductor structure, the first segment and the second trace are implemented on a second metal layer of the semiconductor structure, and the first metal layer is different from the second metal layer.

6. The integrated transformer of claim 5, wherein at least one segment of the first outer turn and at least one segment of the third outer turn are parallel and substantially overlap, and at least one segment of the second outer turn and at least one segment of the fourth outer turn are parallel and substantially overlap.

7. The integrated transformer of claim 6, wherein the first winding has a first inner turn, the second winding has a second inner turn, the third winding has a third inner turn, and the fourth winding has a fourth inner turn; wherein the first inner turn and the third inner turn do not overlap, and the second inner turn and the fourth inner turn do not overlap.

8. The integrated transformer of claim 5, wherein the first winding is substantially surrounded by the third outer turn, and the second winding is substantially surrounded by the fourth outer turn.

9. The integrated transformer of claim 5, wherein an area of the first inductor is smaller than an area of the second inductor.

10. An integrated transformer, comprising:
a first inductor comprising a first winding and a second winding, wherein the first winding has a first outer turn, and the second winding has a second outer turn; and
a second inductor comprising a third winding and a fourth winding, wherein the third winding has a third outer turn, and the fourth winding has a fourth outer turn;
wherein at least one segment of the first outer turn and at least one segment of the third outer turn substantially overlap in a direction perpendicular to a first metal layer and a second metal layer, at least one segment of the second outer turn and at least one segment of the fourth outer turn substantially overlap in the direction perpendicular to the first metal layer and the second metal layer, the first outer turn is connected to the second outer turn through a first segment and a first trace which cross each other, the third outer turn is connected to the fourth outer turn through a second trace and a second segment which cross each other, the first trace and the second segment are implemented on the first metal layer of a semiconductor structure, the first segment and the second trace are implemented on the second metal layer of the semiconductor structure, and the first metal layer is different from the second metal layer.

11. The integrated transformer of claim 10, wherein at least one segment of the first outer turn and at least one segment of the third outer turn are parallel and substantially overlap, and at least one segment of the second outer turn and at least one segment of the fourth outer turn are parallel and substantially overlap.

12. The integrated transformer of claim 11, wherein the first winding has a first inner turn, the second winding has a second inner turn, the third winding has a third inner turn, and the fourth winding has a fourth inner turn; wherein the first inner turn and the third inner turn do not overlap, and the second inner turn and the fourth inner turn do not overlap.

13. The integrated transformer of claim 10, wherein the first winding is substantially surrounded by the third outer turn, and the second winding is substantially surrounded by the fourth outer turn.

14. The integrated transformer of claim 10, wherein an area of the first inductor is smaller than an area of the second inductor.

* * * * *